(12) United States Patent
Park et al.

(10) Patent No.: US 11,990,527 B2
(45) Date of Patent: May 21, 2024

(54) SEMICONDUCTOR DEVICE AND METHOD OF MANUFACTURING THE SAME

(71) Applicants: Hyundai Motor Company, Seoul (KR); Kia Corporation, Seoul (KR)

(72) Inventors: Junghee Park, Suwon-si (KR); Dae Hwan Chun, Suwon-si (KR); Jungyeop Hong, Seoul (KR); Youngkyun Jung, Seoul (KR); Nackyong Joo, Suwon-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 281 days.

(21) Appl. No.: 17/514,947

(22) Filed: Oct. 29, 2021

(65) Prior Publication Data

US 2022/0208979 A1    Jun. 30, 2022

(30) Foreign Application Priority Data

Dec. 31, 2020 (KR) .......... 10-2020-0189638

(51) Int. Cl.
*H01L 29/423* (2006.01)
*H01L 29/40* (2006.01)
*H01L 29/51* (2006.01)
*H01L 29/66* (2006.01)
*H01L 29/78* (2006.01)

(52) U.S. Cl.
CPC ...... *H01L 29/42364* (2013.01); *H01L 29/401* (2013.01); *H01L 29/51* (2013.01); *H01L 29/512* (2013.01); *H01L 29/518* (2013.01); *H01L 29/66712* (2013.01); *H01L 29/7802* (2013.01)

(58) Field of Classification Search
CPC . H01L 29/42364; H01L 29/51; H01L 29/512; H01L 29/66712; H01L 29/7802
See application file for complete search history.

(56) References Cited

U.S. PATENT DOCUMENTS

| | | | | |
|---|---|---|---|---|
| 2010/0314715 | A1* | 12/2010 | Fujimoto | H10B 12/315 257/532 |
| 2015/0303266 | A1* | 10/2015 | Hiyoshi | H01L 29/7802 257/77 |
| 2015/0340374 | A1* | 11/2015 | Jung | H10B 43/40 438/258 |
| 2016/0087064 | A1* | 3/2016 | Ohashi | H01L 29/4958 257/77 |
| 2017/0077084 | A1* | 3/2017 | Shirakawa | H01L 27/0255 |
| 2018/0108774 | A1* | 4/2018 | Chun | H01L 29/1608 |
| 2018/0166540 | A1* | 6/2018 | Chun | H01L 29/1095 |
| 2019/0181261 | A1* | 6/2019 | Okumura | H01L 29/66734 |
| 2022/0208979 | A1* | 6/2022 | Park | H01L 29/66712 |

FOREIGN PATENT DOCUMENTS

CN         110098150 A  *  8/2019   ......... H01L 21/8238

* cited by examiner

*Primary Examiner* — Joseph C. Nicely
(74) *Attorney, Agent, or Firm* — MORGAN, LEWIS & BOCKIUS LLP

(57) ABSTRACT

A semiconductor device includes an n– type layer on a first surface of the substrate, a p type region on a part of the n– type layer, a gate on the n– type layer and the p type region, a first gate protection layer on the gate and a second gate protection layer on the first gate protection layer, a source on the second gate protection layer and the p type region, and a drain on the second surface of the substrate.

15 Claims, 3 Drawing Sheets

SEMICONDUCTOR DEVICE AND METHOD OF MANUFACTURING THE SAME

CROSS-REFERENCE TO RELATED APPLICATION

The present application claims priority to Korean Patent Application No. 10-2020-0189638 filed on Dec. 31, 2020, the entire contents of which is incorporated herein for all purposes by this reference.

BACKGROUND

Field

The present disclosure relates to a semiconductor device and a method of manufacturing the same.

Description of Related Art

Recently, as interests and regulations on the environment have been strengthened, eco-friendly vehicles, representatively, hybrid electric vehicles and the like, are being developed in vehicle industries to respond thereto.

These eco-friendly vehicles convert and use energy stored in a battery to drive a dynamometer motor. Accordingly, as it is important to secure higher energy conversion efficiency, an electric power conversion semiconductor applied to the vehicles, that is, an electric power semiconductor, is getting more increasingly important.

This electric power conversion switching device includes a gate for switching and a source and a drain which are passages of a current. The switching device may be classified into a planar type in which the gate, the source, and the drain are all disposed on top of a wafer and a vertical type in which the gate and the source are disposed on top of the wafer, while the drain is disposed at the bottom portion of the wafer. These two types of switching devices have the gate and the source on top, but these two terminals must be physically and electrically insulated. In general, the gate is formed and then, insulated by an oxide ($Si_xO_y$) layer, which is an insulating layer, and then, a metal source is formed around the gate.

However, when the gate and the insulating layer are formed, a short circuit may occur between the gate and the source under the insulating layer due to characteristics of each process, which appears a gate-source short-circuit bringing about a defect rate of about 1% to about 2% of Si mass-produced devices.

The information disclosed in this Background section is only for enhancement of understanding of the general background of the disclosure and may not be taken as an acknowledgement or any form of suggestion that this information forms the prior art already known to a person skilled in the art.

BRIEF SUMMARY

Various aspects of the present disclosure are directed to providing a semiconductor device and a method of manufacturing the same, which improve a defect rate of the device by blocking a short circuit between a gate and a source.

According to various exemplary embodiments of the present disclosure, a semiconductor device includes an n− type layer on a first surface of the substrate, a p type region on a part of the n− type layer, a gate on the n− type layer and the p type region, a first gate protection layer on the gate, a second gate protection layer on the first gate protection layer, a source on the second gate protection layer and the p type region, and a drain on the second surface of the substrate.

A gate insulating layer between the n− type layer and the gate may be included.

The gate insulating layer may include a conductive polymer in an edge region of the gate insulating layer.

The first gate protection layer may surround the gate, and may include an upper surface portion on the upper surface of the gate and side portions on first and second sides of the gate. The side portions of the first gate protection layer may be disposed on edge regions of the gate insulating layer including a conductive polymer.

The second gate protection layer may surround the first gate protection layer, and may include an upper surface portion on the upper surface of the first gate protection layer and side portions on first and second sides of the first gate protection layer. The side portions of the second gate protection layer may be disposed on side surfaces of an edge region of the gate insulating layer including the conductive polymer.

A lower end portion of the second gate protection layer may be disposed below a lower end portion of the gate and a lower end portion of the first gate protection layer.

The first gate protection layer may include $Si_xN_y$ ($2 \le x \le 4$ and $3 \le y \le 5$).

A thickness of the first gate protection layer may be greater than or equal to about 500 Å.

The second gate protection layer may include $Si_xO_y$ ($1 \le x \le 4$ and $2 \le y \le 8$), $Si_xN_y$ ($2 \le x \le 4$ and $3 \le y \le 5$), or a combination thereof.

A thickness of the second gate protection layer may be about 5000 Å to about 10000 Å.

The substrate may be an n+ type substrate.

It may further include an n+ region on the p type region.

According to another exemplary embodiment of the present disclosure, a method of manufacturing a semiconductor device includes forming an n− type layer, and a p type region on a first surface of a substrate, forming a gate on the n− type layer, forming a first gate protection layer on the gate, forming a second gate protection layer on the first gate protection layer, forming a source on the second gate protection layer and the p type region, and forming a drain on a second surface of the substrate.

The forming of the gate may include forming a gate insulating layer on the n− type layer, forming a gate material layer on the gate insulating layer, and etching the gate material layer to form the gate.

The forming of the first gate protection layer may include forming a first gate protection layer on the gate, and etching a portion of the gate insulating layer which is not protected by the first gate protection layer, using the first gate protection layer as a mask, to remove the portion of the gate insulating layer.

The gate material layer may be etched using an etching gas including $C_4F_6$, $C_4C_8$, or a combination thereof.

The gate insulating layer may include a conductive polymer by etching using an etching gas.

In the removing of the portion of the gate insulating layer by etching, after the gate insulating layer is removed, it may be etched to a partial depth of the p type region.

The method may further include injecting n+ ions into the p type region to form an n+ region, using the first gate protection layer as a mask after etching and removing the gate insulating layer and before forming the second gate protection layer.

The semiconductor device according to various exemplary embodiments of the present disclosure may block the short circuit between the gate and the source, improving the defect rate of the device.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
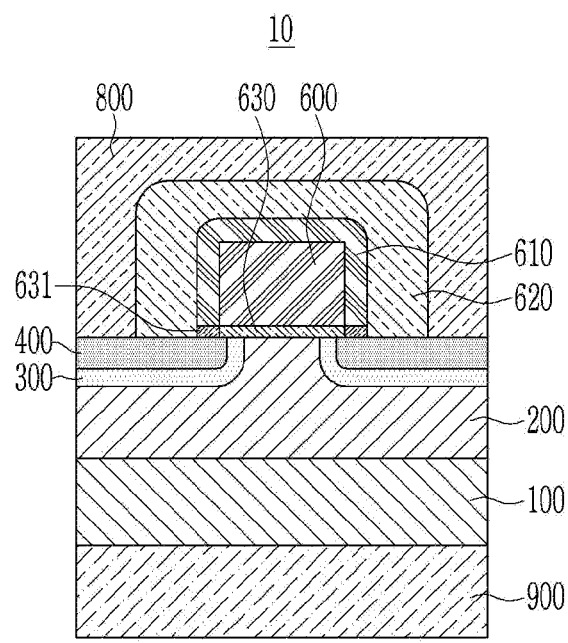
FIG. 1 is a schematic view exemplarily illustrating a cross-section of a semiconductor device according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

The advantages and features of the present disclosure and the methods for accomplishing the same will be apparent from the exemplary embodiments described hereinafter with reference to the accompanying drawings. However, the exemplary embodiments should not be construed as being limited to the exemplary embodiments set forth herein. Unless otherwise defined, all terms (including technical and scientific terms) used herein have the same meaning as commonly understood by one of ordinary skill in the art. The terms defined in a generally-used dictionary may not be interpreted ideally or exaggeratedly unless clearly defined. Furthermore, unless explicitly described to the contrary, the word "comprise," and variations such as "comprises" or "comprising," will be understood to imply the inclusion of stated elements but not the exclusion of any other elements.

Furthermore, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

FIG. 1 is a schematic view exemplarily illustrating an example of a cross-section of a semiconductor device according to an exemplary embodiment of the present disclosure.

Referring to FIG. 1, a semiconductor device 1 includes a substrate 100, an n− type layer 200, a p type region 300, a gate 600, a source 800, and a drain 900.

The substrate 100 may be an n+ type substrate, for example, the substrate 100 may be an n+ type silicon carbide substrate.

The n− type layer 200 may be disposed on the first surface of the substrate 100, and the p type region 300 may be disposed on the n− type layer 200. Optionally, an n+ type region 400 and a p+ type region may be disposed on the p type region 300.

The gate 600 may be disposed on the n− type layer 200 and the p type region 300. When the n+ type region 400 is further included, the gate 600 may be disposed on the n− type layer 200, the p type region 300, and the n+ type region 400. The gate electrode 700 may include polysilicon or metal.

A gate insulating layer 630 may be disposed between the gate 600 and the n− type layer 200. The gate insulating layer 630 may be formed to have a width to cover all the lower end portion of the gate 600, or may be formed to have a width to cover the lower end portion of the first gate protection layer 610, which will be described later.

The gate insulating layer 630 may include silicon oxide ($SiO_2$).

The gate insulating layer 630 may include a conductive polymer in the edge region 631 of the gate insulating layer 630.

When the gate 600 is formed by etching a gate material layer, after pre-depositing the gate insulating layer 630 to prevent damages on the n− type layer 200, the p type region 300, or the like, the etching is performed by use of etching gas having high selectivity ($Cl_2$, $HBr$, $O_2$).

The etching for forming the gate 600 is stopped on the gate insulating layer 630, but the conductive polymer remains on the upper surface of the gate insulating layer 630 due to the etching gas used for high selectivity. The present conductive polymer may cause a short circuit between the gate 600 and the source 800 under the gate insulating layer 630.

To solve the present problem, there may be a method of completely removing the gate insulating layer 630 including the conductive polymer through chemical wet etching such as HF (or BOE) and the like. However, the present method may have a problem of over-etching to completely remove the gate insulating layer 630 to the inside of the gate insulating layer 630 under the gate 600, which is a channel region, and thus narrowing a channel.

Furthermore, there may be another method of adopting a trench structure to form the gate 600 inside the substrate 100 and thus structurally separating the gate 600 and the source 800. However, the present method may solve the short circuit problem of the gate 600 and the source 800 but has another problem of using an expensive CMP process.

The semiconductor device according to various exemplary embodiments of the present disclosure includes the first gate protection layer 610 and the second gate protection layer 620 on the gate 600 to solve the present problem.

The first gate protection layer 610 is disposed on the gate 600 and surrounds and protects the gate 600. Accordingly, the first gate protection layer 610 may include an upper surface portion on the upper surface of the gate 600 and side portions at both sides of the gate 600.

Herein, the side portions of the first gate protection layer 610 may be disposed on the edge regions 631 of the gate insulating layer 630 including the conductive polymer. As described later, the insulating layer 630 may be removed after protecting the gate 600 with the first gate protection layer 610 to solve the problem of making the channel narrow due to the over-etching of the gate insulating layer 630 under the gate 600.

The first gate protection layer 610 may include $Si_xN_y$, (2≤x≤4 and 3≤y≤5). For example, the first gate protection layer 610 may include $Si_3N_4$. When the first gate protection layer 610 includes nitride, the first gate protection layer 610 may be in general minimized from a thickness decrease due to high selectivity with the gate insulating layer 630 including oxide during the removal the gate insulating layer 630. Furthermore, since the thickness of the first gate protection layer 610 is finely adjusted, as described later, when the first gate protection layer 610 may be used as a mask to form the n+ regions 400, the n+ regions 400 may be finely aligned.

The thickness of the first gate protection layer 610 may be greater than or equal to about 500 Å, for example, about 500 Å to about 5000 Å. When the thickness of the first gate protection layer 610 is less than about 500 Å, the gate protection layer 610 may not sufficiently work as a protection layer during the removal of the gate insulating layer 630 through the etching, but when the thickness of the first gate protection layer 610 is greater than about 5000 Å, a length of the conductive polymer may be longer, and a unit cell pitch may be increased.

The second gate protection layer 620 is disposed on the first gate protection layer 610 and surrounds and protects the first gate protection layer 610. Accordingly, the second gate protection layer 620 may include a top portion on the upper surface of the first gate protection layer 610 and side portions at both sides of the first gate protection layer 610.

In the instant case, a lower end portion of the second gate protection layer 620 may be disposed below a lower end portion of the gate 600 and a lower end portion of the first gate protection layer 610. As described later, when the gate insulating layer 630 is removed after protecting the gate 600 with the first gate protection layer 610, since the gate insulating layer 630 is completely removed and then, etched to a partial depth of the p type regions 300, the side portions of the second gate protection layer 620 may be disposed on the side surfaces of edge regions 631 including the conductive polymer of the gate insulating layer 630.

As aforementioned, the edge regions 631 including the conductive polymer under the first gate protection layer 610 may remain and thereby cause a short circuit between the gate 600 and the source 800.

However, the side portions of the second gate protection layer 620 are positioned at the sides of the gate insulating layer 630 and surround and protect the edge regions 631 including the conductive polymer of the gate insulating layer 630 and thus may fundamentally block the short circuit between the gate 600 and the source 800.

The second gate protection layer 620 may include $Si_xO_y$ (1≤x≤4 and 2≤y≤8), $Si_xN_y$ (2≤x≤4 and 3≤y≤5), or a combination thereof. For example, the second gate protection layer 620 may include $SiO_2$, $Si_3N_4$, or a combination thereof.

In other words, the second gate protection layer 620 may be made of $SiO_2$ and a general insulating layer (BPSG, PSG) including the same or the same material as the first gate protection layer 610. Accordingly, the second gate protection layer 620 may be formed by use of a conventional process without a process change.

The second gate protection layer 620 may have a thickness of about 5000 Å to about 10000 Å. When the thickness of the second gate protection layer 620 is less than about 5000 Å, an insulation effect of the second gate protection layer 620 may deteriorate, but when the thickness of the second gate protection layer 620 is greater than about 10000 Å, the unit cell pitch may be increased.

The source 800 is disposed on the second gate protection layer 620, the p type regions 300, and optionally, the n+ type regions 400, and the drain 900 is disposed on the second surface of the substrate 100. Herein, the second surface of the substrate 100 refers to a surface opposite to the first surface of the substrate 100. The source 800 and the drain 900 may include an ohmic metal.

Referring to FIG. 2, FIG. 3, FIG. 4, FIG. 5, FIG. 6, FIG. 7, and FIG. 8, a method of manufacturing the semiconductor device according to FIG. 1 is described.

FIG. 2, FIG. 3, FIG. 4, FIG. 5, FIG. 6, FIG. 7, and FIG. 8 are views sequentially illustrating a method of manufacturing the semiconductor device according to FIG. 1.

Figure 2:
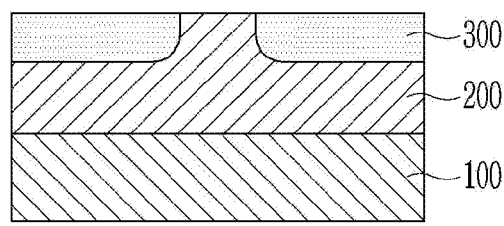
FIG. 2, FIG. 3, FIG. 4, FIG. 5, FIG. 6, FIG. 7, and FIG. 8 are views sequentially illustrating a method of manufacturing a semiconductor device according to another exemplary embodiment of the present disclosure.

Referring to FIG. 2, the substrate 100 is prepared, and the n− type layer 200 is formed on the first surface of the substrate 100. The n− type layer 200 may be formed through epitaxial growth on the first surface of the substrate 100. Herein, the substrate 100 may be an n+ type silicon carbide substrate.

Subsequently, on the n− type layer 200, p type regions 300 are formed. The p type regions 300 may be formed by injecting p ions such as boron (B), aluminum (Al), gallium (Ga), indium (In), and the like into the n− type layer 200. However, the present disclosure is not limited thereto, but the p type regions 30 may be formed on the n− type layer 200 through the epitaxial growth.

Figure 3:
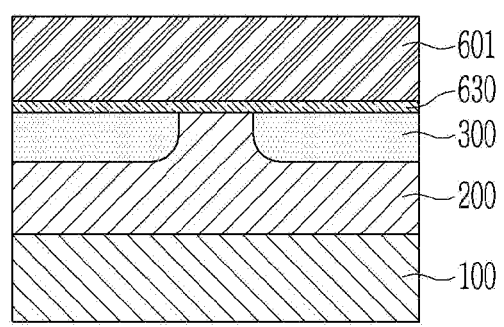

Referring to FIG. 3, on the p type regions 300 and the n− type layer 200, the gate insulating layer 630 is formed, and on the gate insulating layer 630, a gate material layer 601 is formed. The gate material layer 601 may include n-type polysilicon.

Figure 4:
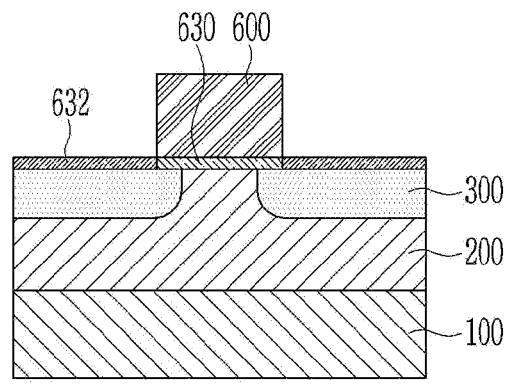

Referring to FIG. 4, a portion of the gate material layer 601 is etched to form the gate 600. The gate 600 is formed on the gate insulating layer 630.

Herein, as the gate material layer 601 is etched by use of etching gas with high selectivity, the gate insulating layer 630 may include regions 632 including the conductive polymer in a portion not protected by the gate 600. The etching of the gate material layer 601 may be performed by use of etching gas including $C_4F_6$, $C_4C_8$, or a combination thereof.

Figure 5:
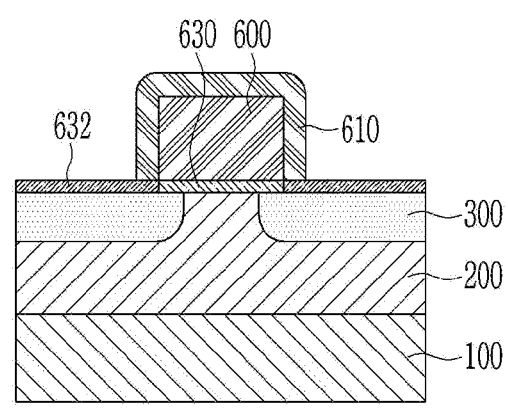

Referring to FIG. 5, on the gate 600, the first gate protection layer 610 is formed. The first gate protection layer 610 surrounds the gate 600 to protect all the upper surface and both sides of the gate 600.

Figure 6:
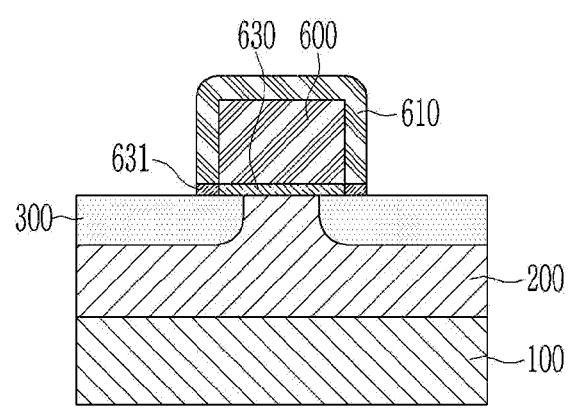

Referring to FIG. 6, while the first gate protection layer 610 is used as a mask, the gate insulating layer 630 not protected by the first gate protection layer 610 and particularly, the regions 632 including the conductive polymer of the gate insulating layer 630 are removed through etching.

Herein, the edge regions 631 including the conductive polymer may remain under the first gate protection layer 610.

Furthermore, when the gate insulating layer 630 is removed, the gate insulating layer 630 may be completely removed and then, etched to a partial depth of the p type region 300. Accordingly, the side portions of the second gate protection layer 620 may be disposed on the side surfaces of the edge regions 631 including the conductive polymer of the gate insulating layer 630.

Figure 7:
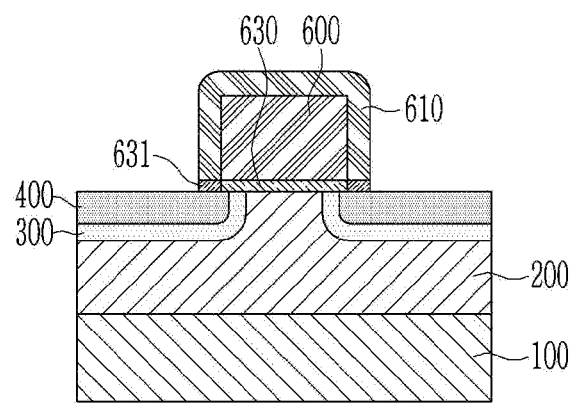

Referring to FIG. 7, before optionally forming the second gate protection layer 620 by etching and removing the gate insulating layer 630, the first gate protection layer 610 may be used as a mask to form the n+ regions 400. Since the thickness of the first gate protection layer 610 is finely adjusted, the first gate protection layer 610 may be used for fine self-alignment of the n+ regions 400.

The n+ type regions 400 may be formed by injecting n ions such as nitrogen (N), phosphorus (P), arsenic (As), antimony (Sb), and the like into the p type regions 300. However, the present disclosure is not limited thereto, but the n+ type regions 400 may be formed through epitaxial growth on the p type regions 300.

Figure 8:
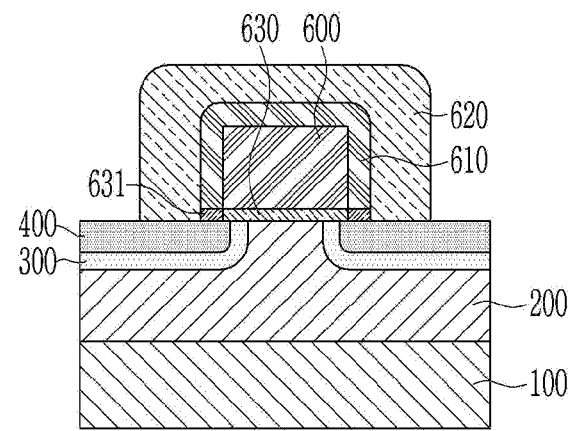

Referring to FIG. 8, the second gate protection layer 620 is formed on the first gate protection layer 610. The second gate protection layer 620 surrounds the first gate protection layer 610 and may all protect the upper surface and both sides of the first gate protection layer 610.

As aforementioned, when the gate insulating layer 630 is removed, the gate insulating layer 630 may be completely remove and then, etched to a partial depth of the p type regions 300, and the side portions of the second gate protection layer 620 may be disposed on the side surfaces of the edge regions 631 including the conductive polymer of the gate insulating layer 630.

Subsequently, the source 900 is formed on the second gate protection layer 620, the p type region 300, and optionally, the n+ type regions 400, and a drain 950 is formed on the second surface of the substrate 100.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A semiconductor apparatus comprising:
   an n− type layer on a first surface of a substrate;
   a p type region on a part of the n− type layer;
   a gate on the n− type layer and the p type region;
   a first gate protection layer on the gate;
   a second gate protection layer on the first gate protection layer;
   a source on the second gate protection layer and the p type region;
   a drain on a second surface of the substrate; and
   a gate insulating layer between the n− type layer and the gate,
   wherein the gate insulating layer includes a conductive polymer in an edge region of the gate insulating layer.

2. The semiconductor device of claim 1,
   wherein the first gate protection layer surrounds the gate,
   wherein the first gate protection layer includes an upper surface portion on an upper surface of the gate and side portions on first and second sides of the gate, and
   wherein the side portions of the first gate protection layer are disposed on edge regions of the gate insulating layer including a conductive polymer.

3. The semiconductor device of claim 1,
   wherein the second gate protection layer surrounds the first gate protection layer,
   wherein the second gate protection layer includes an upper surface portion on an upper surface of the first gate protection layer and side portions on first and second sides of the first gate protection layer, and
   wherein the side portions of the second gate protection layer are disposed on side surfaces of the edge regions of the gate insulating layer including the conductive polymer.

4. The semiconductor device of claim 1, wherein a lower end portion of the second gate protection layer is disposed below a lower end portion of the gate and a lower end portion of the first gate protection layer.

5. The semiconductor device of claim 1, wherein the first gate protection layer includes $Si_xN_y$ ($2 \leq x \leq 4$, $3 \leq y \leq 5$).

6. The semiconductor device of claim 1, wherein a thickness of the first gate protection layer is greater than or equal to about 500 Å.

7. The semiconductor device of claim 1, wherein the second gate protection layer includes $Si_xO_y$ ($1 \leq x \leq 4$ and $2 \leq y \leq 8$), $Si_xN_y$ ($2 \leq x \leq 4$ and $3 \leq y \leq 5$), or a combination thereof.

8. The semiconductor device of claim 1, wherein a thickness of the second gate protection layer is about 5000 Å to about 10000 Å.

9. The semiconductor device of claim 1, wherein the substrate is an n+ type substrate.

10. The semiconductor device of claim 1, further including an n+ region on the p type region.

11. The semiconductor device of claim 10, wherein the n+ region is disposed between the p type region and an imaginary plane formed by lower end portions of the gate, the second gate protection layer, and the source and an edge region of the gate insulating layer.

12. A method of manufacturing a semiconductor device, the method comprising:
   forming an n− type layer, and a p type region on a first surface of a substrate;
   forming a gate on the n− type layer;
   forming a first gate protection layer on the gate;
   forming a second gate protection layer on the first gate protection layer;
   forming a source on the second gate protection layer and the p type region; and
   forming a drain on a second surface of the substrate,
   wherein the forming of the gate includes forming a gate insulating layer on the n− type layer, forming a gate material layer on the gate insulating layer, and etching the gate material layer to form the gate, wherein the forming of the first gate protection layer includes forming the first gate protection layer on the gate, and etching a portion of the gate insulating layer which is not protected by the first gate protection layer, using the first gate protection layer as a mask, to remove the portion of the gate insulating layer, and wherein the gate insulating layer includes a conductive polymer by etching using an etching gas.

13. The method of claim 12, wherein the gate material layer is etched using the etching gas including $C_4F_6$, $C_4C_8$, or a combination thereof.

14. The method of claim 12, wherein in the removing of the portion of the gate insulating layer by etching, the p type region is partially etched to a predetermined depth of the p type region after the portion of the gate insulating layer is removed.

15. The method of claim 12, which further includes injecting n+ ions into the p type region to form an n+ region using the first gate protection layer as a mask after etching and removing the portion of the gate insulating layer and before forming the second gate protection layer.

* * * * *